(12) United States Patent
Uzunoglu

(10) Patent No.: US 9,577,586 B1
(45) Date of Patent: Feb. 21, 2017

(54) FEED REFLECTED DOHERTY AMPLIFIER AND METHOD FOR DRIVING DOHERTY AMPLIFIERS

(71) Applicant: Aselsan Elektronik Sanayi ve Ticaret Anonim Sirketi, Ankara (TR)

(72) Inventor: Erkan Uzunoglu, Ankara (TR)

(73) Assignee: Aselsan Elektronik Sanayi ve Ticaret Anonim Sirketi, Ankara (TR)

( * ) Notice: Subject to any disclaimer, the term of this patent is extended or adjusted under 35 U.S.C. 154(b) by 0 days.

(21) Appl. No.: 14/963,238

(22) Filed: Dec. 9, 2015

(51) Int. Cl.
*H03F 3/19* (2006.01)
*H03F 1/02* (2006.01)
*H03F 1/07* (2006.01)
*H03F 3/21* (2006.01)

(52) U.S. Cl.
CPC ......... *H03F 1/0288* (2013.01); *H03F 3/19* (2013.01); *H03F 3/211* (2013.01); *H03F 2200/451* (2013.01); *H03F 2203/21106* (2013.01)

(58) Field of Classification Search
USPC ............ 330/295, 124 R, 286, 84, 53–54
See application file for complete search history.

(56) References Cited

U.S. PATENT DOCUMENTS 8,461,938 B2 * 6/2013 Noori ............... H01P 5/185
333/112

\* cited by examiner

*Primary Examiner* — Hieu Nguyen
(74) *Attorney, Agent, or Firm* — Gokalp Bayramoglu

(57) ABSTRACT

The feed reflected Doherty amplifier utilizes the output characteristics of the carrier amplifier to control the input signal of the peaking amplifier to improve the gain, linearity and efficiency of a Doherty amplifier. The feed reflected Doherty amplifier comprises an input power splitter, a carrier amplifier branch and a peaking amplifier branch combined into a common load, an output directional coupler and an input directional coupler connected via a phase shift element.

8 Claims, 4 Drawing Sheets

FEED REFLECTED DOHERTY AMPLIFIER AND METHOD FOR DRIVING DOHERTY AMPLIFIERS

FIELD OF THE INVENTION

The present invention relates generally to RF amplifiers and methods for driving amplifiers, more specifically Doherty amplifiers.

BACKGROUND OF THE INVENTION

Modern wireless communications systems including spectrum efficient modulation schemas such as Wideband Code Division Multiple Access (WCDMA), Orthogonal Frequency Division Multiplexing (OFDM) have high peak to average ratio signals. The typical peak to average ratio of the signals in 3G and 4G Long Term Evolution (LTE) systems ranges from 6 dB to 12 dB.

The RF power amplifiers used in wireless communication systems are required to have higher efficiency and linearity to handle such a high peak to average ratio signal. As generally there is a trade-off between the efficiency and linearity. RF power amplifiers achieve the highest efficiency and the worst linearity at the saturation level. At low power level which is also called back-off level, the linearity becomes better while the efficiency decreases. In order to increase the efficiency at back-off level, the load of the amplifier can be changed dynamically according to the level of the input signal, which defined as load modulation. Some well-known examples of load modulation techniques are those used in the Doherty amplifiers and the Chireix-outphasing amplifiers.

The Doherty amplifier, which was first proposed by W. H. Doherty in 1936, is widely used in modern wireless communication systems as it provides higher efficiency over an extended output power range. FIG. 1 illustrates the structure of the conventional Doherty amplifier comprising carrier and peaking amplifier branches combined into a common load. The carrier amplifier is also defined as the main amplifier and biased at Class AB or B, and the peaking amplifier is also defined as the auxiliary amplifier and biased at Class C. The load at the combining node is $Z_0/2$ where $Z_0$ is the matched impedance of the carrier and peaking amplifiers for maximum power and efficiency.

The applied input signal is split by an input power divider. The carrier amplifier is fed directly from the input power divider; whereas the peaking amplifier is connected via the input offset line. The input offset line length is adjusted for phase compensation with the carrier amplifier. The outputs of the carrier and peaking amplifiers are combined into the load via the output offset lines and an impedance inverting network. At the low power levels below a threshold point, only the carrier amplifier is in operation and the peaking amplifier is non-conductive and presents high impedance in ideal conditions. But in practice, with the effect of the package parasitics and matching elements the non-conductive output impedance of the peaking amplifier shifts. Therefore an output offset line is line required in order to have high impedance at the combining node when the peaking amplifier is non-conductive. The output offset line of the carrier amplifier has the same length as the peaking output offset line for phase coherence. The impedance inverting network is configured using a quarter-wavelength line with a characteristic impedance of $Z_0$. For low power levels below the threshold point, the impedance inverting network converts the load impedance $Z_0/2$ to $2Z_0$. When presented with $2Z_0$ load impedance, the carrier amplifier reaches saturation at a power level lower than the rated peak power. This threshold level where the first peak efficiency point is achieved is defined as 6 dB back-off level for a 2-way symmetrical Doherty amplifier.

As the power level increases above the threshold point, the peaking amplifier starts to conduct and the supplied current from the peaking amplifier modulates the load seen by the main amplifier. The current driven by the peaking amplifier increases the voltage on the load, and the impedance seen by the main amplifier gets decreased via the impedance inverting network. As the input signal is increased further both amplifiers will be presented with $Z_0$ and maximum combined power with maximum efficiency is obtained.

Doherty amplifiers are expected to exhibit higher efficiency over an extended output power range without any degradation in gain and linearity characteristics with respect to the same periphery class AB amplifier. In practice, conventional Doherty amplifiers utilizing Si LDMOS or GaN devices achieve lower gain and linearity than the same periphery class AB amplifiers. Biasing the peaking amplifier at class C decreases the total gain of the conventional Doherty amplifier. For the same input voltage level, the output current level of a class C biased amplifier is lower than the same amplifier biased as class B or AB. As the carrier amplifier is allowed to reach saturation at the threshold point which is at least 6 dB below the maximum output power level, the non-linearity produced by the conventional Doherty amplifier is higher than the class AB amplifier with the same periphery. Furthermore, the peaking amplifier operating at class C causes additional non-linearity to the conventional Doherty amplifier characteristics. Nevertheless, for an ideal Doherty amplifier, the carrier amplifier gain compression characteristics and the peaking amplifier gain expansion characteristics can be regarded as correspondingly matched to produce a combined linear behavior. However, considering the trans-conductance (gm) characteristics of the transistors based on the bias and input voltage level and the output-conductance characteristics of the transistors based on the load-line, it is not easy to obtain a matched gain compression and expansion curves for the carrier and peaking amplifiers.

Without concerning the linearity issue and focusing on the efficiency enhancement of the Doherty amplifier, the peaking amplifier is desired to conduct above the threshold point where the carrier amplifier reaches saturation. So, the input power division ratio, the bias points of the carrier and peaking amplifiers must be strictly configured to achieve higher efficiency over an extended output power range.

A common technique to improve the efficiency, gain and linearity properties of the Doherty amplifiers is known as "Bias-adapted Doherty amplifier". FIG. 2 illustrates the block diagram of the bias-adapted Doherty amplifier. This technique utilizes analog or digital circuits to control the input power and/or the bias level of the peaking amplifier according to the input signal level. Control circuits first detect the envelope of the input signal level and change the input power and/or the bias point of the peaking amplifier above a predetermined threshold point. Bias adaptation schemes require extra analog, digital circuit periphery and especially for wide instantaneous bandwidth applications, the delay and the speed of the control circuits become more critical in terms of extra additional power dissipation. The main drawback of this technique is the challenge of shaping the peaking amplifier behavior without using any feedback from the carrier amplifier.

The conventional feed-forward linearization technique utilizes the output characteristics of the main amplifier and provides a high level of linearization while disregarding any concern for efficiency. FIG. 3 illustrates the schematic diagram of the feed-forward amplifier. There are 2 loops; first is the cancellation loop and second is the correction loop. In the cancellation loop, the forward output signal of the main amplifier is sampled by a coupler and subtracted from the input signal to obtain only the non-linear products of the main amplifier. In the correction loop, these non-linear products are amplified by an error amplifier and combined with the main amplifier output by an output coupler. Although this technique provides a good linearization, because of the DC power wasted by the error amplifier and the lack of any efficiency enhancement schema such as load modulation, feed-forward amplifiers provide a low level of efficiency and are not widely preferred in modern wireless communication systems.

SUMMARY OF THE INVENTION

The feed reflected Doherty amplifier utilizes the output characteristics of the carrier amplifier to control the input signal of the peaking amplifier to improve the gain, linearity and efficiency of a Doherty amplifier. The feed reflected Doherty amplifier provides a simple and compact implementation including two couplers and a phase shift element. The reflected signal at the output of the carrier amplifier is sampled by an output coupler and combined with the input signal to drive the peaking amplifier.

Utilizing the reflected signal at the output of the carrier amplifier and self-activated threshold point wherein the peaking amplifier starts to conduct are the main differences of the feed reflected Doherty amplifier from the prior art. All load modulation techniques are established on a platform of changing load impedance of the amplifiers based on the input signal level. In Doherty technique, the load impedance of the carrier amplifier is initially set to a greater value than the matched value $Z_0$ and remains constant up to a threshold point. The threshold point is commonly selected as a first peak efficiency point where the carrier amplifier reaches saturation and the peaking amplifier starts to conduct. The threshold point is initially configured by the input power division ratio and the bias conditions of the carrier and peaking amplifiers to achieve the required gain, efficiency and linearity characteristics. Below the threshold point, as the load impedance seen by the carrier amplifier is constant and greater than the matched value $Z_0$, the reflected signal at the output of the carrier amplifier increases with the increasing input signal of the Doherty amplifier. Above the threshold point the load impedance seen by the carrier amplifier begins to decrease to the matched value $Z_0$ and correspondingly the reflected signal at the output of the carrier amplifier reaches to a saturation value and starts to decrease from the saturation value to zero value ideally. Combining the reflected signal of the carrier amplifier and input signal with appropriate phase and amplitude generates a driving signal for the peaking amplifier. As the reflected signal of the carrier amplifier is directly proportional to the input signal below the threshold point, the both signals can be cancelled by applying an out of phase combining. So, the resultant driving signal remains substantially lowered amplitude below the threshold point. At the threshold point where the reflected signal at the output of the carrier amplifier reaches to saturation, the said driving signal starts to increase inversely proportional to the output characteristics of the carrier amplifier. So, the invented technique provides a flexibility to synthesize the inverse characteristics of the carrier amplifier at the peaking amplifier side to improve the gain and linearity while maintaining efficiency. Furthermore, this invented technique allows the peaking amplifier to operate at Class B or AB bias conditions for enhancing the gain and linearity of the Doherty amplifier.

Another aspect discussed above is to achieve an ideal Doherty efficiency curve in practical conditions without regarding the linearity. This objective can also be achieved by adjusting the coupling ratios of the couplers and the bias point of the peaking amplifier in the feed reflected Doherty amplifier topology.

The threshold point is commonly selected as the first peak efficiency point where the carrier amplifier reaches saturation and the peaking amplifier starts to conduct. The threshold point is initially adjusted by the input power division ratio and the bias conditions in conventional Doherty amplifiers and by the additional control circuits in bias-adapted Doherty amplifiers. The threshold point adjustments must be updated over the operating temperature and/or frequency band range. In the feed reflected Doherty amplifier, the threshold point is initially adjusted by the coupling ratios of the couplers and adaptively updated as the transition at the threshold point is self-activated by the saturation characteristics of the carrier amplifier over the operating temperature and/or frequency band range.

As discussed above, the conventional Doherty amplifiers have lower gain and linearity than the class AB amplifiers with same periphery. The feed reflected Doherty amplifier utilizing the reflected signal at the output of the carrier amplifier improves the gain and linearity of the Doherty amplifier while maintaining efficiency. The feed reflected Doherty amplifier also provides a flexibility to enhance the efficiency of the Doherty amplifier under practical conditions.

The feed reflected Doherty amplifier comprises an input power splitter, a carrier amplifier branch and a peaking amplifier branch combined into a common load, an output directional coupler and an input directional coupler connected via a phase shift element. The input power splitter divides the input signal into a first split signal and a second split signal. The carrier amplifier branch amplifies the first split signal to generate an output signal which includes forward and reflected signals as the load impedance seen by the carrier amplifier is different from the matched load value $Z_0$. A divided ratio of the reflected signal at the output of the carrier amplifier branch is combined with the second split signal to drive the peaking amplifier branch. The input signal of the peaking amplifier remains substantially lowered below a threshold point and increases with an expansive curve including the inverse characteristics of the carrier amplifier above the threshold point.

A method of driving a Doherty amplifier is presented to improve the gain, linearity and the efficiency characteristics of the Doherty amplifier. The method utilizes the output characteristics of the carrier amplifier to control the input signal of the peaking amplifier. In the method, the input signal is divided into a first split signal and a second split signal. The first signal is used for driving the carrier amplifier to produce a forward output signal and a reflected output signal. The reflected signal at the output of the carrier amplifier is sampled and combined with the second split signal to drive the peaking amplifier.

BRIEF DESCRIPTION OF FIGURES

A Feed Reflected Doherty amplifier and method for driving a Doherty amplifier realized to fulfill the objective of the present invention is illustrated in the accompanying figures, in which.

DETAILED DESCRIPTION OF THE INVENTION

Figure 5:
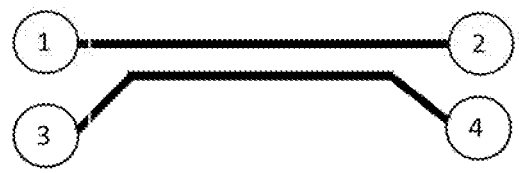
FIG. 5 illustrates the schematic diagram of a directional coupler.

Elements shown in the figures are numbered as follows:
1. Feed reflected Doherty amplifier
2. Input power splitter
3. Input directional coupler
4. Carrier amplifier
5. Peaking amplifier
6. Output directional coupler
7. Impedance inverting network
8. Input offset transmission line
9. Phase shift element
10. Load Feed reflected Doherty amplifier 1 essentially comprises;
at least one input power splitter 2 which divides an input signal to produce a first split signal and a second split signal,
at least one carrier amplifier 4 for amplifying the first split signal to generate the carrier output signal, has a reflection coefficient at its output which remains constant below a threshold point and decreases depending on the load current driven by a peaking amplifier 5 above the said threshold point,
at least one peaking amplifier 5 operating in class B which amplifies the combined signal at the output of the input directional coupler to generate the peaking output signal,
at least one impedance inverting network 7 coupled to the output of the carrier amplifier 4,
at least one output directional coupler 6 coupled at the output path of the carrier amplifier 4 to have a reflected coupled output signal of the carrier amplifier 4 at its isolated port, which increases in accordance with the increasing carrier amplifier 4 output signal below the said threshold point and decreases with the decreasing output reflection coefficient of the carrier amplifier 4 above the said threshold point,
at least one phase shift element 9 connected to the isolated port of the output coupler 6 to adjust the phase of the said reflected coupled output signal,
at least one input directional coupler 3 coupled between the input power splitter 2 and the input path of the peaking amplifier 5, and its isolated port is connected to the phase shift element 9 to combine the said second split signal of the input power splitter 2 and the said reflected coupled output signal of the carrier amplifier 4 to drive the peaking amplifier 5 with a dynamically controlled signal which remains in a substantially lowered amplitude below the said threshold point and increases with the decreasing output reflection coefficient of the carrier amplifier 4 above the said threshold point,
at least one load 10, Before describing the details of the invention, it will be useful to give a brief explanation of the directional coupler. FIG. 5 shows a directional coupler with port numbers 1-4. When the input signal is applied to port 1; port 2 is the output port, port 3 is defined as the coupled port and port 4 is defined as the isolated port. C, coupling ratio is the amplitude ratio of the input signal and the coupled signal at the coupled port. Directivity is the amplitude ratio of the input signal to the reflected coupled signal at the isolated port. Coupled port has the coupled part of the forward signal with a coupling ratio (C), and the isolated port has the reflected coupled part of the reflected signal with the same coupling ratio (C).

Figure 1:
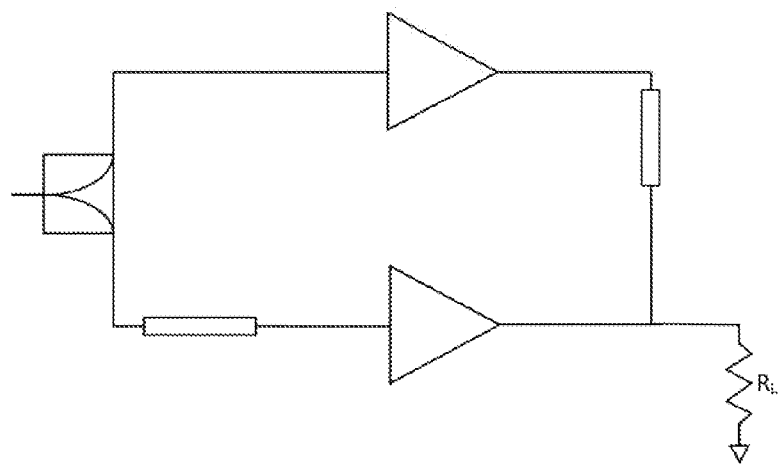
FIG. 1 illustrates the block diagram of the conventional Doherty amplifier.
Figure 2:
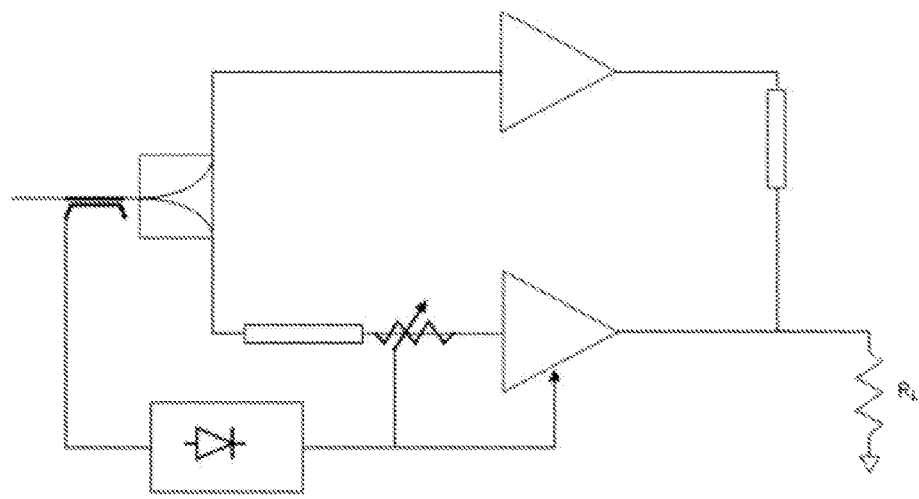
FIG. 2 illustrates the block diagram of the bias-adapted Doherty amplifier.
Figure 3:
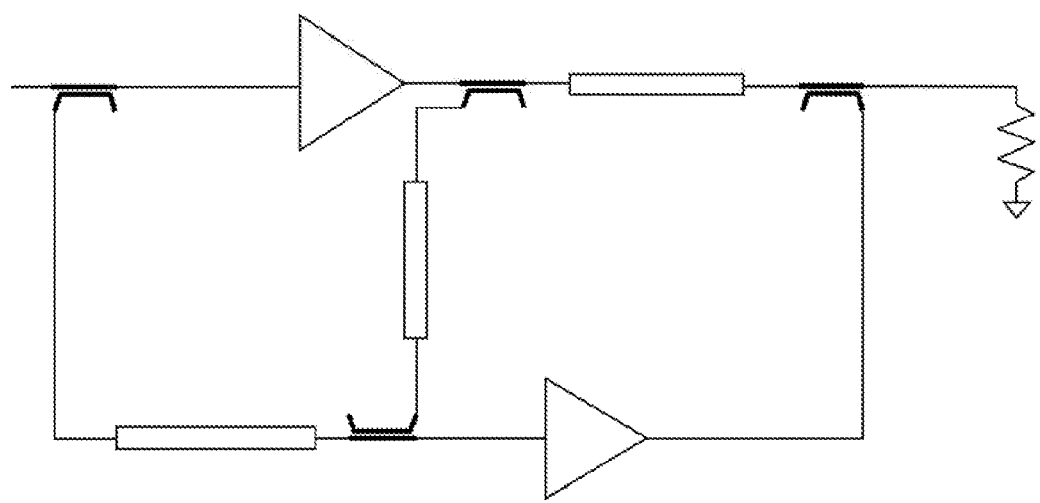
FIG. 3 illustrates the block diagram of the feed-forward linearization amplifier.
Figure 4:
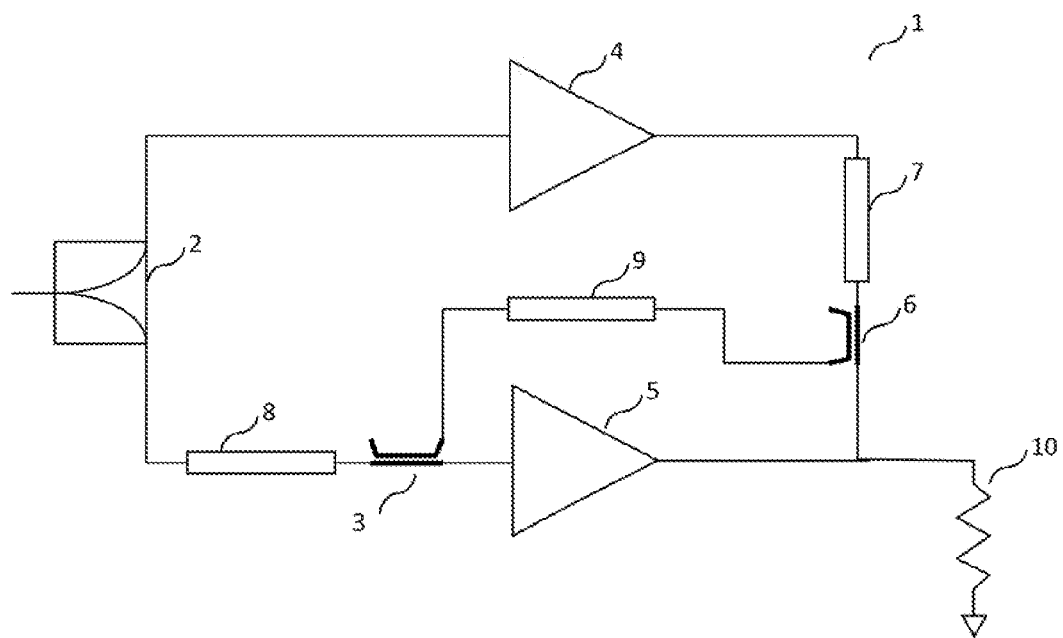
FIG. 4 illustrates the block diagram of the feed reflected Doherty amplifier.

FIG. 4 illustrates the structure of the feed reflected Doherty amplifier 1 comprising a carrier amplifier 4 and a peaking amplifier 5, input power splitter 2, input directional coupler 3, output directional coupler 6, input offset transmission line 8, a phase shift element 9, and impedance inverting network 7. The carrier amplifier 4 branch and the peaking amplifier 5 branch are combined to a common load 10. The carrier amplifier 4 and the peaking amplifier 5 can be comprised of one or more stages. The input offset transmission line 8, the phase shift element 9, and the impedance inverting network 7 are phase shifting elements with a characteristic impedance of $Z_0$. The input offset transmission line 8, the phase shift element 9, and the impedance inverting network 7 can be replaced by equivalent lumped-element components. The input directional coupler 3, output directional coupler 6 are the coupled microstrip or strip-line transmission lines where the distance between the coupled lines and the length of the coupled lines determine the coupling ratio, C. The input directional coupler 3, output directional coupler 6 can also be replaced by equivalent lumped-element components.

The input power splitter 2 receives an input RF (radio frequency) signal and divides it into a first split signal and a second input signal to drive the carrier amplifier 4 branch and the peaking amplifier 5 branch, respectively. The carrier amplifier 4 is fed directly from input power splitter 2; whereas the peaking amplifier 5 is connected via the input offset transmission line 3. The length of the input offset transmission line 3 is adjusted for phase equalization of the amplifier branches. The output of the peaking amplifier 5 is directly connected to the load 10. The output of the carrier amplifier 4 is connected to the impedance inverting network 7. The output directional coupler 6 can be connected either between the impedance inverting network 7 and the load 10, or between the carrier amplifier 4 and the impedance inverting network 7. The input directional coupler 3 is connected between the input offset transmission line 8 and the input of the peaking amplifier 5. The isolated ports of the input and the output directional couplers 3 and 6 are connected to each other via the phase shift element 9.

The input signal is divided by the input power splitter 2 into a first split signal and a second split signal. The carrier amplifier 4 amplifies the first split signal to generate the carrier output signal. The carrier amplifier 4 has a reflection coefficient at its output as the load impedance seen by the carrier amplifier 4 is different from $Z_0$, where $Z_0$ is the matched impedance required for maximum output power and efficiency. The reflection coefficient $\Gamma$ is defined as the ratio of the amplitude of the reflected signal to the amplitude of the incident signal.

The load 10 terminated at the combining node has an impedance value of $R_L=Z_0/(1+\alpha)$ where $\alpha$ is the periphery ratio of the carrier amplifier 4 and the peaking amplifier 5. For a symmetrical configuration where the carrier amplifier 4 and the peaking amplifier 5 have the same periphery, the load 10 impedance value is $R_L=Z_0/2$. And $Z_C$ the load impedance seen by the carrier amplifier 4 is expressed as $Z_C=R_L(1+I_P/I_C)$, where $I_C$ is the output current of the carrier amplifier 4, and $I_P$ is the output current of the peaking amplifier 5. The reflection coefficient at the output of the carrier amplifier 4 is given by; $\Gamma_C=(Z_C-Z_0)/(Z_C+Z_0)$. For a symmetrical Doherty configuration where $Z_C=Z_0/2(1+I_P/I_C)$, the reflection coefficient at the output of the carrier amplifier 4 can be written as;

$$\Gamma_C=(I_P-I_C)/(I_P+3I_C)$$

Below the threshold point wherein the peaking amplifier 5 is non-conductive and $I_P$ is zero; the reflection coefficient at the output of the carrier amplifier 4 has a constant value which is equal to $-\frac{1}{3}$ for a symmetrical Doherty configuration. The threshold point is commonly preferred as the first peak efficiency point where the carrier amplifier 4 reaches saturation and the peaking amplifier 5 starts to conduct. Above the threshold point wherein the peaking amplifier 5 starts to conduct, the reflection coefficient at the output of the carrier amplifier 4 starts to decrease with the increasing peaking amplifier current $I_P$ and eventually converges to zero as h, is equal to $I_C$ at the maximum output power level. So, the carrier amplifier 4 has a reflection coefficient at its output which remains constant below a threshold point and decreases depending on the load current driven by the peaking amplifier 5 above the said threshold point. As the reflection coefficient $\Gamma$ is equal to the amplitude ratio of the reflected signal the incident signal, $V_R$ the reflected signal voltage at the output of the carrier amplifier 4 is expressed as $V_R=\Gamma_C V_C$ where $V_C$ is the output voltage of the carrier amplifier 4. Below the threshold point wherein the reflection coefficient $\Gamma_C$ is constant, the reflected signal at the output of the carrier amplifier 4 increases with the increasing carrier amplifier 4 output signal and decreases with the decreasing output reflection coefficient of the carrier amplifier $\Gamma_C$ above the said threshold point.

Figure 6:
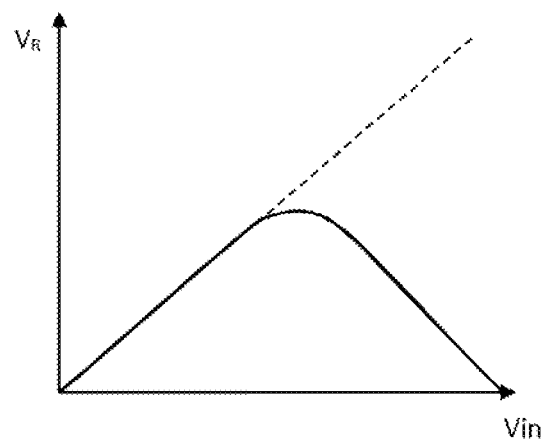
FIG. 6 illustrates the voltage variation of the reflected signal at the output of the carrier amplifier 4 with respect to the voltage of the input signal.

FIG. 6 illustrates the voltage variation of the reflected signal at the output of the carrier amplifier 4 with respect to the voltage of the input signal. The reflected signal at the output of the carrier amplifier 4 reaches a saturation level at the threshold point and starts to decrease above the threshold point. At the maximum input level, the reflected signal $V_R$ converges to zero as the reflection coefficient $\Gamma_C$ decreased to zero in ideal conditions.

The input port of the output directional coupler 6 is connected to the carrier amplifier 4 output path, the output port is connected to the load 10, and the isolated port is connected to the isolated port of the input directional coupler 3 via the phase shift element 9. The output directional coupler 6 samples the incident and the reflected signals at the output path of the carrier amplifier 4 with a coupling ratio of $C_O$. Therefore, the reflected coupled signal at the isolated port of the output directional coupler 6 is a divided part of the reflected signal at the output of the carrier amplifier 4, which increases in accordance with the increasing carrier amplifier 4 output signal below the said threshold point and decreases with the decreasing output reflection coefficient of the carrier amplifier 4 above the said threshold point. The amplitude of the reflected coupled signal at the isolated port of the output directional coupler 6 is equal to $C_O V_R$. The phase shift element 9 coupled in series between the isolated ports of the input and the output directional couplers adjusts the phase of the reflected coupled signal to apply to the isolated port of the input directional coupler 3. The phase shift element 9 can be implemented by a micro-strip, stripline transmission line or lumped-element equivalent. The electrical length of the transmission line determines the phase shift value of the phase shift element 9.

The input port of the input directional coupler 3 is connected to one output path of the input power splitter 2, the output port is connected to the input of the peaking amplifier 5, and the isolated port is connected to the isolated port of the output directional coupler 6 via the phase shift element 9. The input directional coupler 3 combines the said second split signal of the input power splitter 2 with the said reflected coupled signal to generate a driving signal for the peaking amplifier 5. In the case of an equal input power division, the said first and second split signals can be considered as the half of the input signal of the Doherty amplifier. So, the said driving signal at the output of the input directional coupler 3 $V_{IP}$ can be expressed as;

$$V_{IP}=V_{in}/2+C_I C_O V_R$$

where $V_{in}/2$ is the second split signal and the $C_I$ is the coupling ratio of the input directional coupler 3. The reflected signal voltage at the output of the carrier amplifier 4 is also written as $V_R=\Gamma_C V_C=\Gamma_C G_C(V_{in}/2)$ where $G_C$ is the gain of the carrier amplifier 4 and $V_{in}/2$ is the first split signal. By substituting the resultant $V_R$ equation into the $V_{IP}$ equation, the output signal of the input directional coupler 3 $V_{IP}$ can be rewritten as;

$$V_{IP}=(1+C_I C_O \Gamma_C G_C)(V_{in}/2)$$

Below the threshold point wherein the reflection coefficient $\Gamma_C$ is equal to $-\frac{1}{3}$, the coupling ratios of the input and output couplers is adjusted to cancel the said second split signal and the said reflected coupled signal which results in a zero amplitude signal at the output of the input directional coupler 3. And above the threshold point, the output signal of the input directional coupler 3 $V_{IP}$ increases with the decreasing output reflection coefficient of the carrier amplifier 4 and converges to the maximum input level of the said second split signal. At the threshold point wherein the carrier amplifier 4 reaches saturation with gain compression; the output signal of the input directional coupler 3 $V_{IP}$ starts to increase with the decreasing gain of the carrier amplifier 4 $G_C$, and activates the peaking amplifier 5 to conduct. So, the peaking amplifier 5 is self-activated by the saturation and gain compression of the carrier amplifier 4 which is commonly preferred for an optimum Doherty amplifier operation.

Figures 7A, 7B:
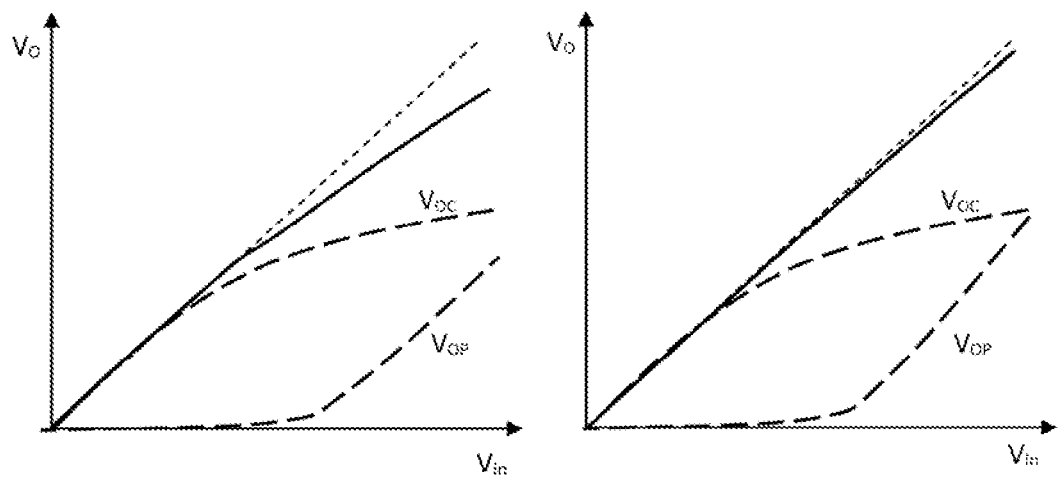
FIG. 7A and FIG. 7B illustrate the comparison of the conventional Doherty amplifier and the preferred embodiment in terms of the voltage waveforms of the carrier and peaking amplifiers.
Figure 8:
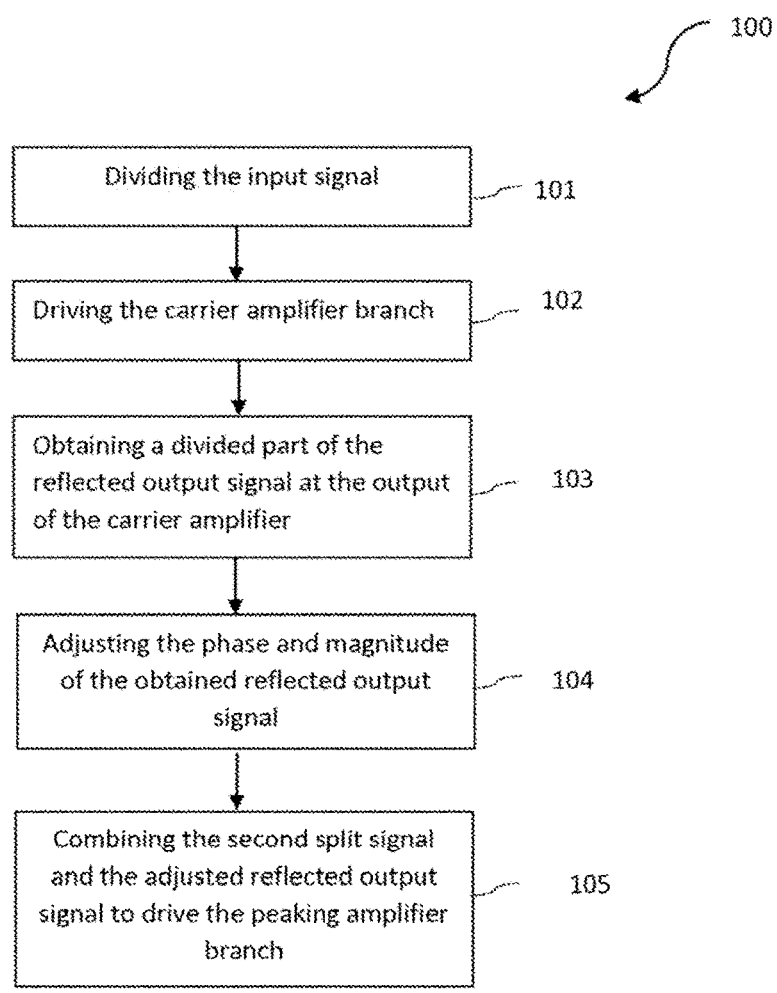
FIG. 8 is the flow chart of method for driving a Doherty amplifier

The peaking amplifier 5 amplifies the combined signal at the output of the input directional coupler 3 $V_{IP}$ to generate peaking output signal. As the output signal of the input directional coupler 3 $V_{IP}$ is substantially lowered below the threshold point, the peaking amplifier 5 is allowed to operate at class B or AB bias conditions which improve the total gain and linearity of the Doherty amplifier. The output signals of the peaking amplifier 5 and the carrier amplifier 4 are combined to the common load 10 to generate the final output signal of the Doherty amplifier 1. The input signal of the peaking amplifier which is the output signal of the input directional coupler 3 and expressed as above equation;

$$V_{IP}=(1+C_I C_O \Gamma_C G_C)(V_{in}/2),$$

is proportional to the gain and output reflection characteristics of the carrier amplifier. By adjusting the initial parameters such as the coupling ratios of the input and output directional couplers $C_I, C_O$, and the phase of the phase shift element 9, the preferred embodiment provides a flexibility to synthesize an inverse gain compression characteristics at the peaking amplifier 5 branch which improves the linearity of the Doherty amplifier 1 while maintaining the efficiency. FIG. 7 illustrates the comparison of the conventional Doherty amplifier and the preferred embodiment in terms of the voltage waveforms of the carrier and peaking amplifiers. In FIG. 7, the output voltage of the carrier amplifier $V_{OC}$ and the output voltage of the peaking amplifier $V_{OP}$ are illustrated with dashed lines, the combined output voltage of the Doherty amplifier $V_O$ is illustrated with solid line. FIG. 7.*b* illustrates the preferred embodiment with an improved gain and linearity performance.

A method 100 of driving a Doherty amplifier said method 100 comprising the steps of;

Dividing the input signal to produce a first split signal and a second split signal (101), Driving the carrier amplifier 4 branch with the said first split signal to produce an output signal including forward and reflected output signals (102), Obtaining a divided part of the said reflected output signal (103), Adjusting the phase and magnitude of the obtained reflected output signal (104), Combining the second split signal and the adjusted reflected output signal to drive the peaking amplifier branch (105).

In the method 100, the input signal is divided into two; a first split signal and a second split signal in step 101. In step 102, the first signal is used for driving the carrier amplifier 4 branch of the Doherty amplifier. Being driven by the first signal, the carrier amplifier 4 produces a forward output signal and a reflected output signal. In step 103, the reflected signal at the output of the carrier amplifier 4 is sampled and a divided part of the said reflected output signal is obtained. In step 104, the phase and magnitude of the obtained reflected output signal are adjusted. In step 105, the adjusted reflected output signal and second split signal are combined for driving the peaking amplifier 5.

The invention claimed is:

1. A feed reflected Doherty amplifier comprising;
   at least one input power splitter which divides the input signal to produce a first split signal and a second split signal,
   at least one carrier amplifier amplifying the first split signal to generate the carrier output signal and having a reflection coefficient at its output which remains constant below a threshold point and decreases depending on the load current driven by the peaking amplifier above the said threshold point,
   at least one impedance inverting network coupled to the output of the carrier amplifier,
   at least one output directional coupler coupled at the output path of the carrier amplifier to have a reflected coupled output signal of the carrier amplifier at its isolated port, which increases in accordance with the increasing carrier amplifier output signal below the said threshold point and decreases with the decreasing output reflection coefficient of the carrier amplifier above the said threshold point,
   at least one phase shift element connected to the isolated port of the output coupler to adjust the phase of the said reflected coupled output signal,
   at least one input directional coupler coupled between the input power splitter and the input path of the peak amplifier, and its isolated port is connected to the phase shift element to combine the said second split signal of the input power splitter and the said reflected coupled output signal of the carrier amplifier to drive the peaking amplifier with a dynamically controlled signal which remains in a substantially lowered amplitude below the said threshold point and increases with the decreasing output reflection coefficient of the carrier amplifier above the said threshold point,
   at least one peaking amplifier operating in class B which amplifies the combined signal at the output of the input directional coupler to generate a peaking output signal,
   at least one load.

2. The Feed-reflected Doherty amplifier according to claim 1 wherein the input port of the output directional coupler is connected to the carrier amplifier output path, the output port is connected to the load, and the isolated port is connected to the isolated port of the input coupler via the phase shift element.

3. The Feed-reflected Doherty amplifier according to claim 1 wherein the input port of the input directional coupler is connected to one output path of the input power splitter, the output port is connected to the input of the peaking amplifier, and the isolated port is connected to the isolated port of the output coupler via the phase shift element.

4. The Feed-reflected Doherty amplifier according to claim 1 wherein the output directional coupler produces a sampled reflected signal at the isolated port, which increases to a threshold level proportional to the said carrier amplifier output signal until the carrier amplifier reaches saturation, and which starts to decrease from the threshold level as the said peaking output signal increases.

5. The Feed-reflected Doherty amplifier according to claim 1 wherein the input directional coupler receives the said second split signal from the input power splitter and the said reflected coupled output signal from the output directional coupler via the phase shift element to generate a low level signal below the threshold point, and an increasing signal above the threshold point.

6. The Feed-reflected Doherty amplifier according to claim 1 wherein the coupling ratio of the output coupler and the phase value of the phase shift element are determined correspondingly to apply the said reflected coupled output signal with comparable magnitude and negative phase to the isolated port of the input coupler, wherein the combination of the said reflected coupled output signal with the said second split signal results in a substantial decrease in the input signal level of the peaking amplifier until the main amplifier reaches saturation.

7. The Feed-reflected Doherty amplifier according to claim 1 wherein the peaking amplifier configured to operate at class B is driven by a dynamically controlled input signal which level substantially lowered by the contribution of the said sampled reflected signal below a threshold level, and which level monotonically increases above the threshold level.

8. A method of driving a Doherty amplifier comprising the steps of,
   Dividing the input signal to produce a first split signal and a second split signal,
   Driving the carrier amplifier branch with the said first split signal to produce an output signal including forward and reflected output signals, Obtaining a divided part of the said reflected output signal,
Adjusting the phase and magnitude of the obtained reflected output signal,
Combining the second split signal and the adjusted reflected output signal to drive the peaking amplifier branch.

* * * * *